United States Patent
Jiang et al.

(10) Patent No.: US 8,384,179 B2
(45) Date of Patent: Feb. 26, 2013

(54) BLACK SILICON BASED METAL-SEMICONDUCTOR-METAL PHOTODETECTOR

(75) Inventors: Yadong Jiang, Chengdu (CN); Jing Jiang, Chengdu (CN); Anyuan Zhang, Chengdu (CN); Zhengyu Guo, Chengdu (CN); Guodong Zhao, Chengdu (CN); Zhiming Wu, Chengdu (CN); Wei Li, Chengdu (CN)

(73) Assignee: University of Electronic Science and Technology of China, Chengdu, Sichaun Province (CN)

( * ) Notice: Subject to any disclaimer, the term of this patent is extended or adjusted under 35 U.S.C. 154(b) by 99 days.

(21) Appl. No.: 12/835,656

(22) Filed: Jul. 13, 2010

(65) Prior Publication Data
US 2012/0012967 A1 Jan. 19, 2012

(51) Int. Cl.
*H01L 31/0236* (2006.01)
(52) U.S. Cl. ............... 257/449; 257/E31.006; 438/92
(58) Field of Classification Search .............. 257/449, 257/E31.066; 438/92
See application file for complete search history.

(56) References Cited

U.S. PATENT DOCUMENTS

| 4,728,370 A * | 3/1988 | Ishii et al. ............... 136/258 |
| 2003/0043444 A1* | 3/2003 | Christenson ............... 359/231 |
| 2005/0145963 A1* | 7/2005 | Saitoh ............... 257/428 |
| 2006/0091489 A1* | 5/2006 | Cheng et al. ............... 257/458 |
| 2007/0122934 A1* | 5/2007 | Lin et al. ............... 438/69 |
| 2009/0218493 A1* | 9/2009 | McCaffrey et al. ........ 250/338.4 |
| 2010/0074396 A1* | 3/2010 | Schmand et al. ............... 378/19 |

* cited by examiner

*Primary Examiner* — Tom Thomas
*Assistant Examiner* — Christopher M Roland

(57) ABSTRACT

A black silicon based metal-semiconductor-metal photodetector includes a silicon substrate and a black silicon layer formed on the silicon substrate. An interdigitated electrode pattern structure is formed on the black silicon layer, which can be a planar or U-shaped structure. A thin potential barrier layer is deposited at the interdigitated electrode pattern structure. An Al or transparent conductive ITO thin film is deposited on the thin potential barrier layer. A passivation layer is provided on the black silicon layer. In the black silicon based metal-semiconductor-metal photodetector, the black silicon layer, as a light-sensitive area, can respond to ultraviolet, visible and near infrared light.

20 Claims, 2 Drawing Sheets

BLACK SILICON BASED METAL-SEMICONDUCTOR-METAL PHOTODETECTOR

BACKGROUND OF THE PRESENT INVENTION

1. Field of Invention

The present invention relates to a photoelectric detection technology, and more particularly to a black silicon based metal-semiconductor-metal photodetector and method of manufacture thereof.

2. Description of Related Arts

Silicon is an important semiconductor material, and currently also a main material used in the microelectronics integrated circuit process, and plays a very important role in the very large scale integrated circuit (VLSI). Compared with other compound optoelectronic devices, the optoelectronic devices and optoelectronic integrated circuits manufactured by the mature standard integrated circuit (IC) process using silicon as a basic material, will have a great advantage, however, the research on the silicon-based photodetector still has no great breakthrough at present. When the light wave is incident on the surface of the silicon-based optoelectronic device, the reflected light energy can be about 30%, so the responsivity of the silicon-based metal-semiconductor-metal photodetector (MSM-PD) is only about 0.2 A/W, and its quantum efficiency is very low and about 0.34. Therefore, the key issue to be resolved in the silicon-based MSM-PD is still the low sensitivity.

Black silicon is a microstructure layer on the surface of silicon. The existence of the microstructure layer can significantly improve the optoelectronic property of silicon material, so it has become the hot topic of research in recent years. For the preparation of the microstructure layer on the surface of silicon, many methods can be used, which include an electrochemical method, reaction ion etching (RIE) and laser chemistry method. The laser chemistry method for preparing black silicon material can not only obtain regular micro-needle arrays on the surface of silicon, increase the absorption coefficient of the material, but also introduce high doping impurities, and widen the optical absorption scope of the material, thus showing the wide application prospects of black silicon material in the optoelectronics field.

Therefore, a black silicon layer is obtained by the ion implantation and preparation of the surface microstructure. Furthermore, a black silicon based metal-semiconductor-metal photodetector is prepared, and it has a wide spectral response range and high responsivity.

SUMMARY OF THE PRESENT INVENTION

An object of the present invention is to provide a black silicon based metal-semiconductor-metal photodetector, using the silicon as a basic material, which is compatible with the standard process, thus its design and manufacturing process is not complex.

Another object of the present invention is to provide a black silicon based metal-semiconductor-metal photodetector, which has a wide spectral response range and high responsivity, and can be used for ultraviolet, visible and near-infrared detection, wherein a photosensitive layer is a layer of black silicon with high doping concentration and anti-reflection.

Another object of the present invention is to provide a method of manufacturing a black silicon layer on a silicon substrate, a metal-semiconductor-metal photodetector based on the black silicon layer manufactured by the method has a good device performance.

Accordingly, in order to accomplish the above objects, the present invention provides a black silicon based metal-semiconductor-metal photodetector, comprising:

a silicon substrate;

a black silicon layer formed on the silicon substrate;

an interdigitated electrode pattern structure having a plurality of electrode regions penetrating through the black silicon layer and spaced from each other;

a potential barrier layer provided within each of the electrode regions;

an interdigitated electrode provided on the potential barrier layer within each of the electrode regions; and a passivation layer provided on the black silicon layer.

Also, a method of manufacturing a black silicon layer on a silicon substrate comprises the steps of:

(1) implanting a doping material by an ion implantation method into the silicon substrate;

(2) preparing a surface microstructure on a surface of the silicon substrate; and (3) applying a vacuum heat treatment process to the doped silicon substrate with the surface microstructure.

These and other objectives, features, and advantages of the present invention will become apparent from the following detailed description, the accompanying drawings, and the appended claims.

DETAILED DESCRIPTION OF THE PREFERRED EMBODIMENT

Black silicon is a silicon surface layer by a special treatment. Impurity elements with high concentration are introduced into a silicon substrate by an ion implantation for widening the spectrum absorption range of the silicon substrate. Furthermore, a microstructure anti-reflection layer is formed on a surface of the silicon substrate for reducing the light reflection to improve the light absorptivity. Therefore, the spectrum absorption range of the device based on black silicon will be widened, and the responsibility thereof will be improved.

A method of preparing a black silicon layer on a silicon substrate comprises the steps of:

(1) implanting a doping material by an ion implantation method into the silicon substrate;

(2) preparing a surface microstructure on a surface of the silicon substrate; and (3) applying a vacuum heat treatment process to the doped silicon substrate with the surface microstructure.

In the step (1), the doping material can be S or Se or Te, an energy of the ion implantation is 10~200 KeV, a doping concentration is in the range of $1\times10^{14}$~$5\times10^{15}$ ions/cm$^2$.

A pyramidal micro-cone structure with a size of 1 μm~5 μm and a depth of 1 μm~5 μm is obtained on a (100) silicon crystal face by the corrosion of KOH solution, wherein a proportion of the KOH solution is 2~12 g KOH, 6~100 ml deionized water and 6~25 ml isopropyl alcohol, a heating temperature is 60~90° C.

Moreover, the surface microstructure can be prepared on a surface of a (100) or (110) or (111) silicon crystal face. The preparation of the surface microstructure can be obtained by anodizing, or by the corrosion of HF solution catalyzed by metal nanoparticles, wherein the metal nanoparticles, such as Pt, Au and Ag, can be obtained by evaporation, sputtering or chemical reduction. A diameter of each of micropores of the surface microstructure is 10~200 nm, a distance between two adjacent micropores is 20~100 nm, a depth of each of micropores is 100 nm~5 μm.

Furthermore, the vacuum heat treatment is at a temperature of 200~1000° C. for 30 minutes.

Figure 1:
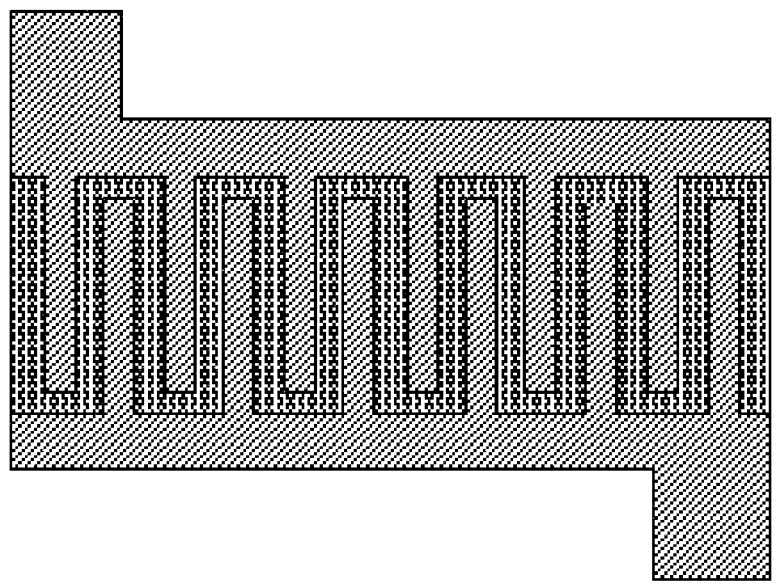
FIG. 1 is a top view of the interdigitated electrodes and black silicon layer of the present invention.
Figure 2:
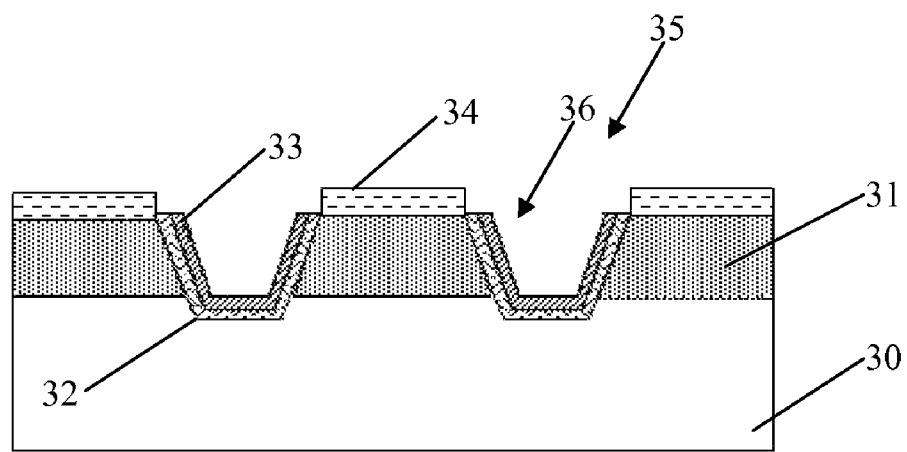
FIG. 2 is a schematic view of a black silicon based metal-semiconductor-metal photodetector according to a first preferred embodiment of the present invention.

Referring to FIG. 2, a black silicon based metal-semiconductor-metal photodetector according to a first preferred embodiment of the present invention is illustrated, wherein the black silicon based metal-semiconductor-metal photodetector comprises a silicon substrate 30; a black silicon layer 31 formed on the silicon substrate 30; an interdigitated electrode pattern structure 35 having a plurality of U-shaped electrode regions 36 penetrating through the black silicon layer 31, extended into the silicon substrate 30 and spaced from each other; a potential barrier layer 32 provided on the interdigitated electrode pattern structure 35, namely, provided along sidewalls and a bottom of each of the U-shaped electrode regions 36; an interdigitated electrode 33 provided on the potential barrier layer 32 and within each of the U-shaped electrode regions 36; and a passivation layer 34 provided on the black silicon layer 31.

Preferably, the silicon substrate 30 is a monocrystalline silicon at a (100) or (110) or (111) crystal face.

Furthermore, the black silicon layer 31 is a light-sensitive layer with a thickness of 1~10 μm.

Furthermore, the potential barrier layer 32 is an a-Si:H thin film with a thickness of 30~100 nm.

Furthermore, the interdigitated electrode 33 is a deposited AL thin film or Cr/Au thin film or transparent conductive tin-doped indium oxide (ITO) thin film.

Furthermore, the passivation layer 34 is made of $Si_3N_4$ or $SiO_2$.

Furthermore, a response wavelength of the black silicon based metal-semiconductor-metal photodetector is in the range of 250~1300 nm.

Furthermore, when the response wavelength of the black silicon based metal-semiconductor-metal photodetector is in the range of 250~800 nm, a responsibility of which is about 120 A/W; when the response wavelength of the black silicon based metal-semiconductor-metal photodetector is in the range of 800~1300 nm, a responsibility of which is about 0.5 A/W.

Furthermore, a width of the interdigitated electrode 33 is 3~10 μm, a distance between an interdigitated electrode within one of the U-shaped electrode regions and an interdigitated electrode within an adjacent U-shaped electrode region is 5~15 μm, a thickness of the interdigitated electrode 33 is 50~100 nm, a depth of each of the U-shaped electrode regions 36 is 3~10 μm.

Accordingly, a method of manufacturing a black silicon based metal-semiconductor-metal photodetector according to the first preferred embodiment comprises the steps of:

(1) applying a layer of photoresist onto a surface of the black silicon layer 31 in a spinning manner, and patterning the layer of photoresist by a special mask pattern;

(2) removing an unprotected black silicon layer on the pattern by immerging the patterned silicon substrate into an alkali etching solution for a special time of corrosion;

(3) forming an interdigitated electrode pattern structure 35 by corroding in the KOH solution with a special concentration, wherein the interdigitated electrode pattern structure 35 has a plurality of U-shaped electrode regions 36 penetrating through the black silicon layer 31, extended into the silicon substrate 30 and spaced from each other, a depth of each of the U-shaped electrode regions is 3~10 μm;

(4) depositing a thin a-Si:H potential barrier layer 32 with a thickness of about 30~100 nm for improving the Schottky contact characteristic between an electrode material and the black silicon layer to reduce the dark current and restrain the leakage current;

(5) depositing a Al or tin-doped indium oxide (ITO) thin film with a thickness of about 50~100 nm as an interdigitated electrode 33, and stripping thus obtaining a black silicon based metal-semiconductor-metal photodetector, wherein a width of the interdigitated electrode 33 is 3~10 μm, a distance between an interdigitated electrode within one of the U-shaped electrode regions and an interdigitated electrode within an adjacent U-shaped electrode region is 5~15 μm, a thickness of the interdigitated electrode 33 is 50~100 nm;

(6) depositing a $Si_3N_4$ or $SiO_2$ thin film on a surface of the black silicon layer 31 as a surface passivation layer 34, wherein a thickness of the surface passivation layer 34 is in the range of 50~100 nm; and (7) applying a vacuum heat treatment to the device at a special temperature for 30 minutes after step (6), so as to increase a contact characteristics between the Al or ITO thin film and the black silicon layer.

The potential barrier layer 32 is deposited by magnetron sputtering.

Furthermore, the interdigitated electrode 33, made of Al or ITO, is formed by magnetron sputtering.

Furthermore, the passivation layer 34 is formed by evaporation or MOCVD.

Furthermore, in the step (7), the vacuum heat treatment is applied at a temperature of 200~1000° C. for 30 minutes.

Figure 3:
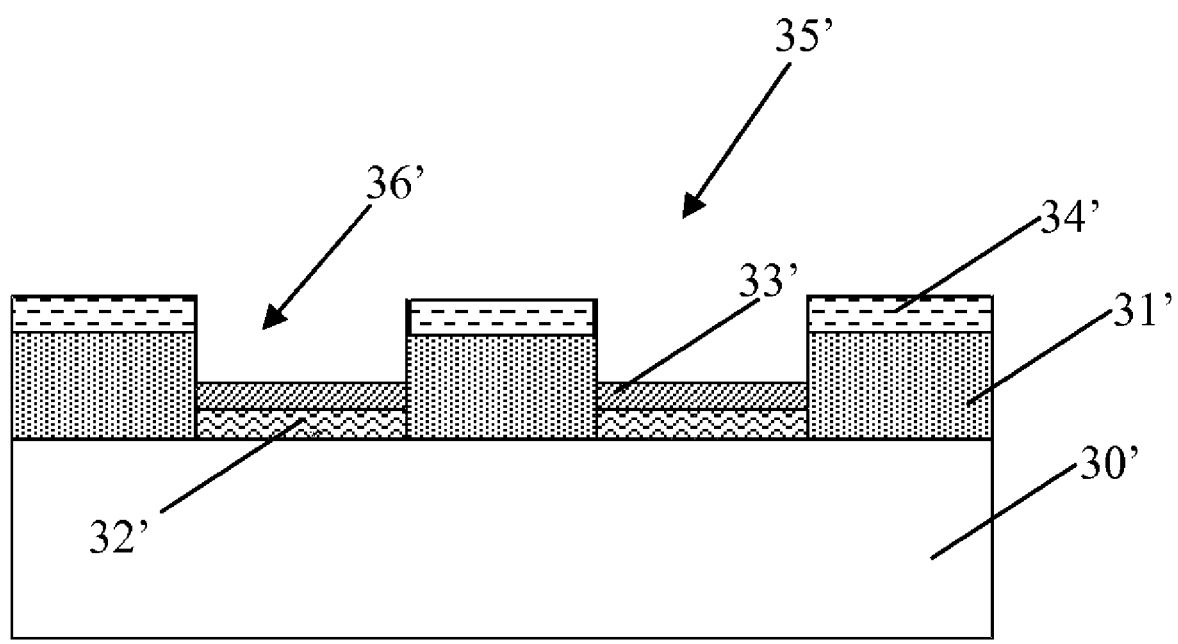
FIG. 3 is a schematic view of the black silicon based metal-semiconductor-metal photodetector according to a second preferred embodiment of the present invention.

Referring to FIG. 3, a black silicon based metal-semiconductor-metal photodetector according to a second preferred embodiment of the present invention is illustrated, wherein the black silicon based metal-semiconductor-metal photodetector comprises a silicon substrate 30'; a black silicon layer 31' formed on the silicon substrate 30'; an interdigitated electrode pattern structure 35' having a plurality of electrode regions 36' penetrating through the black silicon layer 31' on the silicon substrate 30', and spaced from each other; a potential barrier layer 32' provided on the silicon substrate 30' within each of the electrode regions 36'; an interdigitated electrode 33' provided on the potential barrier layer 32' within each of the electrode regions 36'; and a passivation layer 34' provided on the black silicon layer 31'.

Compared with the first embodiment of the present invention, the second embodiment cancels the step (3) of the first embodiment, and the other steps are the same as those explained in the first embodiment.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A black silicon based metal-semiconductor-metal photodetector, comprising:
   a silicon substrate;
   a black silicon layer formed on said silicon substrate;
   an interdigitated electrode pattern structure having a plurality of U-shaped electrode regions, wherein each of said U-shaped electrode regions penetrates through said black silicon layer, extends into said silicon substrate and is spaced from each other;
   a potential barrier layer on an inner wall of each of said U-shaped electrode regions;
   an interdigitated electrode provided on said potential barrier layer; and
   a passivation layer provided on said black silicon layer.

2. The black silicon based metal-semiconductor-metal photodetector, as recited in claim 1, wherein said black silicon layer has a surface microstructure and is doped with a doping material.

3. The black silicon based metal-semiconductor-metal photodetector, as recited in claim 2, wherein said doping material is S or Se or Te implanted by an ion implantation method.

4. The black silicon based metal-semiconductor-metal photodetector, as recited in claim 3, wherein said silicon substrate is a monocrystalline silicon at a (100) or (110) or (111) crystal face.

5. The black silicon based metal-semiconductor-metal photodetector, as recited in claim 4, wherein said black silicon layer is a light-sensitive layer.

6. The black silicon based metal-semiconductor-metal photodetector, as recited in claim 5, wherein said potential barrier layer is an a-Si:H thin film.

7. The black silicon based metal-semiconductor-metal photodetector, as recited in claim 6, wherein said interdigitated electrode is a thin film selected from the group consisting of a deposited Al thin film, a Cr/Au thin film and a transparent conductive tin-doped indium oxide thin film.

8. The black silicon based metal-semiconductor-metal photodetector, as recited in claim 7, wherein said passivation layer is made of $Si_3N_4$ or $SiO_2$.

9. The black silicon based metal-semiconductor-metal photodetector, as recited in claim 8, wherein said surface microstructure is a pyramidal micro-cone structure formed by corroding a surface of said silicon substrate using KOH solution.

10. The black silicon based metal-semiconductor-metal photodetector, as recited in claim 9, wherein a proportion of said KOH solution is 2~12 g KOH, 6~100 ml deionized water and 6~25 ml isopropyl alcohol, and a heating temperature is 60~90° C.

11. The black silicon based metal-semiconductor-metal photodetector, as recited in claim 8, wherein said surface microstructure is formed by a corrosion of HF solution catalyzed by metal nanoparticles, wherein said metal nanoparticles are a metal material selected from the group consisting of Pt, Au and Ag, and are obtained by evaporation or sputtering or chemical reduction.

12. The black silicon based metal-semiconductor-metal photodetector, as recited in claim 3, wherein said surface microstructure is a pyramidal micro-cone structure formed by corroding a surface of said silicon substrate using KOH solution.

13. The black silicon based metal-semiconductor-metal photodetector, as recited in claim 12, wherein a proportion of said KOH solution is 2~12 g KOH, 6~100 ml deionized water and 6~25 ml isopropyl alcohol, and a heating temperature is 60~90° C.

14. The black silicon based metal-semiconductor-metal photodetector, as recited in claim 3, wherein said surface microstructure is formed by a corrosion of HF solution catalyzed by metal nanoparticles, wherein said metal nanoparticles are a metal material selected from the group consisting of Pt, Au and Ag, and are obtained by evaporation or sputtering or chemical reduction.

15. A black silicon based metal-semiconductor-metal photodetector, comprising:
   a silicon substrate;
   a black silicon layer formed on said silicon substrate;
   an interdigitated electrode pattern structure having a plurality of electrode regions, wherein each of said electrode regions penetrates through said black silicon layer, is provided on said silicon substrate and spaced from each other;
   a potential barrier layer provided on said silicon substrate within each of said electrode regions;
   an interdigitated electrode provided on said potential barrier layer; and
   a passivation layer provided on said black silicon layer.

16. The black silicon based metal-semiconductor-metal photodetector, as recited in claim 15, wherein said black silicon layer has a surface microstructure and is doped with a doping material, wherein said doping material is S or Se or Te implanted by an ion implantation method.

17. The black silicon based metal-semiconductor-metal photodetector, as recited in claim 16, wherein said silicon substrate is a monocrystalline silicon at a (100) or (110) or (111) crystal face, said black silicon layer is a light-sensitive layer, said potential barrier layer is an a-Si:H thin film, said interdigitated electrode is a thin film selected from the group consisting of a deposited Al thin film, a Cr/Au thin film and a transparent conductive tin-doped indium oxide thin film, and said passivation layer is made of $Si_3N_4$ or $SiO_2$.

18. The black silicon based metal-semiconductor-metal photodetector, as recited in claim 17, wherein said surface microstructure is a pyramidal micro-cone structure formed by corroding a surface of said silicon substrate using KOH solution.

19. The black silicon based metal-semiconductor-metal photodetector, as recited in claim 18, wherein a proportion of said KOH solution is 2~12 g KOH, 6~100 ml deionized water and 6~25 ml isopropyl alcohol, and a heating temperature is 60~90° C.

20. The black silicon based metal-semiconductor-metal photodetector, as recited in claim 17, wherein said surface microstructure is formed by a corrosion of HF solution catalyzed by metal nanoparticles, wherein said metal nanoparticles are a metal material selected from the group consisting of Pt, Au and Ag, and are obtained by evaporation or sputtering or chemical reduction.

* * * * *